(12) United States Patent
Ashdown et al.

(10) Patent No.: US 7,738,002 B2
(45) Date of Patent: Jun. 15, 2010

(54) CONTROL APPARATUS AND METHOD FOR USE WITH DIGITALLY CONTROLLED LIGHT SOURCES

(75) Inventors: Ian Ashdown, West Vancouver (CA); Shane P. Robinson, Gibsons (CA)

(73) Assignee: Koninklijke Philips Electronics N.V., Eindhoven (NL)

( * ) Notice: Subject to any disclaimer, the term of this patent is extended or adjusted under 35 U.S.C. 154(b) by 570 days.

(21) Appl. No.: 10/557,817

(22) PCT Filed: Oct. 12, 2005

(86) PCT No.: PCT/CA2005/001547
§ 371 (c)(1),
(2), (4) Date: Oct. 13, 2006

(87) PCT Pub. No.: WO2006/039790
PCT Pub. Date: Apr. 20, 2006

(65) Prior Publication Data
US 2007/0153026 A1 Jul. 5, 2007

Related U.S. Application Data

(60) Provisional application No. 60/522,546, filed on Oct. 12, 2004, provisional application No. 60/664,415, filed on Mar. 23, 2005, provisional application No. 60/669,121, filed on Apr. 7, 2005.

(51) Int. Cl.
*G09G 5/10* (2006.01)

(52) U.S. Cl. .......................................... 345/691; 345/82

(58) Field of Classification Search ......... 345/690–692, 345/82, 76, 204
See application file for complete search history.

(56) References Cited

U.S. PATENT DOCUMENTS

| | | | |
|---|---|---|---|
| 3,787,752 A | 1/1974 | Delay | |
| 3,873,920 A * | 3/1975 | Apple et al. | 714/775 |
| 4,090,189 A | 5/1978 | Fisler | |
| 4,307,369 A | 12/1981 | Jackson, Jr. | |
| 5,067,704 A | 11/1991 | Tsuihiji et al. | |
| 5,625,636 A | 4/1997 | Bryan et al. | |
| 5,781,742 A * | 7/1998 | Asano et al. | 710/100 |

(Continued)

FOREIGN PATENT DOCUMENTS

CA 2419515 8/2003

(Continued)

OTHER PUBLICATIONS

Author Unknown, "LEDs Magazine Review", IOP Publishing and Cabot Media Ltd., Issue 3, pp. 1-38, Oct. 2005.

(Continued)

*Primary Examiner*—Amr Awad
*Assistant Examiner*—Stephen G Sherman

(57) ABSTRACT

The present invention provides an extension to a standard N-bit digital pulse width control method which can discriminate $2^N$ discrete pulse widths per pulse cycle. The present invention provides a method and apparatus that can modulate the pulse widths over a period of $2^M$ pulse cycles in which each pulse cycle can have its own pulse width or respective duty cycle. The resulting time averaged or effective pulse width therefore can be controlled with a resolution of $2^{N+M}$ states rather than a resolution of $2^N$ states as is common with standard methods.

15 Claims, 13 Drawing Sheets

U.S. PATENT DOCUMENTS

| | | |
|---|---|---|
| 6,381,426 B1 | 4/2002 | Werner, Jr. et al. |
| 6,392,577 B1 | 5/2002 | Swanson et al. |
| 6,507,159 B2 | 1/2003 | Muthu |
| 6,576,881 B2 | 6/2003 | Muthu et al. |
| 6,630,801 B2 | 10/2003 | Schuurmans |
| 6,753,661 B2 | 6/2004 | Muthu et al. |
| 6,833,691 B2 | 12/2004 | Chapuis |
| 6,967,978 B2 | 11/2005 | Ohmori |
| 7,176,948 B2 | 2/2007 | Lewis |
| 2002/0005861 A1* | 1/2002 | Lewis .................... 345/691 |

FOREIGN PATENT DOCUMENTS

| | | |
|---|---|---|
| JP | 03006921 | 1/1991 |
| WO | WO02/080625 | 10/2002 |
| WO | WO03/037042 | 5/2003 |
| WO | WO03/107319 | 12/2003 |

OTHER PUBLICATIONS

Gage et al., "Optoelectronics Applications Manual", McGraw-Hill Book Company, New York, New York, p. 9.12, 1977.

Mo et al., "Consecutive PWM Driving Video Led Display System", IEEE International Symposium on Circuits and Systems, pp. 1437-1439, Jun. 9-12, 1997.

Rea, Mark Stanley (ed.), "IESNA Lighting Handbook", $9^{th}$ Edition, p. 27-4, Dec. 2000.

Rea, Mark Stanley (ed.), "IESNA Lighting Handbook", $9^{th}$ Edition, p. 3-21, Dec. 2000.

Zukauskas et al., "Introduction to Solid-State Lighting", John Wiley & Sons, Inc., New York, New York, p. 136, 2002.

* cited by examiner

CONTROL APPARATUS AND METHOD FOR USE WITH DIGITALLY CONTROLLED LIGHT SOURCES

FIELD OF THE INVENTION

The present invention pertains to the field of lighting and in particular to a method and apparatus for controlling the amount of light emitted by one or more digitally controlled light sources.

BACKGROUND

Advances in the development and improvements of the luminous flux of light-emitting diodes (LEDs) such as solid state and organic light-emitting diodes have made these devices suitable for use in general illumination applications, including architectural, entertainment, and roadway lighting, for example. As such, light-emitting diodes are becoming increasingly competitive with light sources such as incandescent, fluorescent, and high-intensity discharge lamps.

Light-emitting diodes offer a number of advantages and are generally chosen for their ruggedness, long lifetime, high efficiency, low voltage requirements, and the possibility to control the colour and intensity of the emitted light independently. They provide improvement over delicate gas discharge lamp, incandescent, and fluorescent lighting systems. Solid state and improvingly organic light-emitting diodes have the capability to create the same lighting impressions of other lighting technologies and can greatly outweigh the drawbacks associated therewith.

Unlike for classical incandescent light sources, the intensity and colour of light emitted by LEDs can be independently controlled. Provided that parameters, for example die temperature, which can affect the spectral distribution of light emitted by the device remain constant, the total emitted light can be controlled without substantially changing the colour impression. Light emission in an LED only occurs when the current through the device exceeds a certain threshold and from there on the current can be safely increased up to a specific maximum value. Controlling a stable constant light output therefore requires precisely controlling the direct current through an LED. However, certain applications only require controlling the average light output over time.

Consequently, rapid repetitive switching between no light emission and full light emission such as for example by the use of pulse width modulation (PWM) or pulse code modulation may be sufficient to achieve a desired lighting effect.

While PWM is a useful technique for dimming LEDs, it has to meet a number of special requirements in order to create apparent lighting effects that will be pleasantly perceived by humans. The need for perceptually smooth dimming, particularly with square law equalization to compensate for the non-linear brightness response of the human visual system, generally requires controlling the light output with 12 to 14 bit resolution whereas standard mainstream hardware PWM circuits only support ten bit resolution. Moreover, due to the intensity undergoing 100% modulation, the PWM frequency typically must be higher than about 300 Hz in order to avoid perceptible flickering of the light produced. In addition, because the components of LEDs can transport and store heat at different rates, higher PWM frequencies can reduce the effects of stress caused by thermal cycling of the device and in typical LED packages detrimental effects of temperature fluctuations can become negligible for PWM frequencies beyond about $10^3$ to $10^4$ Hz.

Brightness control of LEDs has been addressed in a number of United States patents, for example U.S. Pat. No. 3,787,752 which describes intensity control for a light emitting diode display. The invention describes how a series of power pulses can be used to effectively control LEDs that are unmatched in their lighting characteristics for low electric currents but matched for electric currents near their optimal operating conditions. This document however, does not describe how the duty factors of the power pulses can be reproducibly and discretely set and is also only defined as it would be applied to displays.

U.S. Pat. No. 4,090,189 discloses another brightness control circuit for LED displays. The invention describes a PWM method for controlling LEDs over a relatively wide range of brightness levels also extending stable operation into the lower brightness region. This disclosure also does not describe how the duty factors of the power pulses can be reproducibly and discretely set to control brightness of the LEDs at a desired resolution.

U.S. Pat. No. 6,833,691 discloses a system and method for providing digital pulse width modulation. The invention describes a pulse width modulation system for use in a switching power supply circuit that provides high-resolution pulse width modulated signals. The system is configured to receive a control signal comprising a (m+n)-bit binary word and to provide a pulse width modulated signal with a predetermined average duty cycle having a resolution of substantially $2^{(m+n)}$. The pulse width modulation system includes a timing circuit for providing $2^m$ timing signals, a dithering circuit, and a signal generator. Upon receiving the control signal, the dithering circuit is configured to provide a modified control signal, which comprises a series of up to $2^n$ m-bit binary words. The signal generator is configured to receive the timing signals and the modified control signal and to provide the pulse width modulated signal having a duty cycle, which, when averaged over $2^n$ timing cycles, is approximately equal to the predetermined average duty cycle. The pulse width modulated signal is used by a switching power supply circuit to control at least one power switching device. In particular, this invention uses a complicated signal generating circuit with adders, delays, multiplexers, memory, and latch modules. In addition, in its preferred embodiment, (m+n)-bit control words are mapped into a sequence of m-bit PWM duty factors in a way that creates artefacts when the (m+n)-bit word assumes its maximum value of $2^{m+n}-1$.

Therefore, there is a need for an improved and simplified control apparatus and method for use with digitally controlled light sources that is both robust against noisy signals and can effectively enhance the resolution level of control of digitally controlled light sources.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

An object of the present invention is to provide a control apparatus and method for use with digitally controlled light sources. In accordance with an aspect of the present invention, there is provided an apparatus for control of a luminaire including one or more light-emitting elements in one or more colours, each of the one or more light-emitting elements supplied with electrical current to produce light, said apparatus comprising: means to adjust the electrical current to the one or more light-emitting elements using pulse width modulation or pulse code modulation, each of said pulse width modulation and pulse code modulation having a pulse cycle; and means to modulate a pulse width for each pulse cycle, thereby increasing control resolution of the one or more light-emitting elements.

In accordance with another aspect of the present invention there is provided an extended pulse width modulation method for transforming a (N+M)-bit signal into a stream of $2^M$ words of N-bit width for a total of $2^M$ pulse cycles, the method comprising the steps of: receiving the (N+M)-bit signal; splitting the (N+M)-bit signal into an N-bit portion and an M-bit portion; interpreting the N-bit portion as a binary coded number n; interpreting the M-bit portion as a binary coded number m; encoding (n+1) in a form of a binary N-bit word and feeding the word for m pulse cycles into the stream; and encoding n in a form of a binary N-bit word for ($2^M$−m) pulse cycles and feed the word into the stream; thereby forming the stream of $2^M$ words of N-bit width for a total of $2^M$ pulse cycles.

In accordance with another aspect of the invention, there is provided an extended pulse width modulation apparatus for transforming a (N+M)-bit signal into a stream of $2^M$ words of N-bit width for a total of $2^M$ pulse cycles, the apparatus comprising: means for receiving the (N+M)-bit signal; means for splitting the (N+M)-bit signal into an N-bit portion and an M-bit portion; means for interpreting the N-bit portion as a binary coded number n; means for interpreting the M-bit portion as a binary coded number m; means for encoding (n+1) in a form of a binary N-bit word and feeding the word for m pulse cycles into the stream; and means for encoding n in a form of a binary N-bit word for ($2^M$−m) pulse cycles and feed the word into the stream; thereby forming the stream of $2^M$ words of N-bit width for a total of $2^M$ pulse cycles.

DETAILED DESCRIPTION OF THE INVENTION

Definitions

Figure 1:
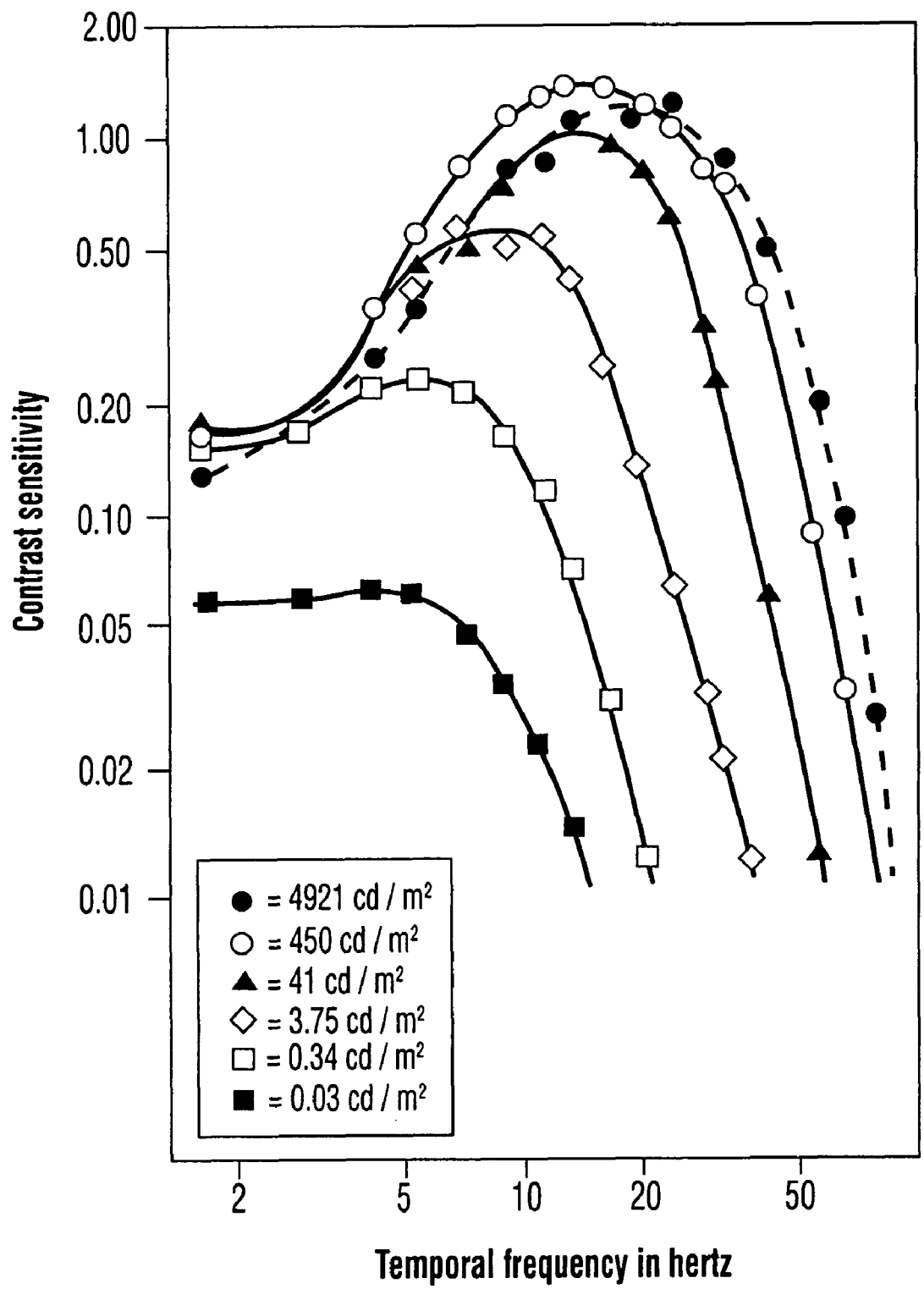
FIG. 1 illustrates the relationship between temporal frequency and contrast sensitivity of the human visual system.

The term "light source" is used to define one or more devices capable of emitting radiation in any region or combination of region of the electromagnetic spectrum, wherein the activation and deactivation of the light source can be digitally controlled. A light source can include one or more light emitting elements, for example. A light source may also be configured as a plurality of light-emitting elements which emit one or more different colours of light, for example a light source can be a collection of red, green and blue light-emitting elements.

The term "light-emitting element" is used to define any device that emits radiation in any region or combination of regions of the electromagnetic spectrum for example visible, infrared and/or ultraviolet light, when activated by applying a potential difference across it or passing an electrical current through it. Examples of light-emitting elements include semi-conducting inorganic, organic materials based, polymer, phosphor coated or high-flux light-emitting diodes (LEDs) or other similar devices as would be readily understood.

As used herein, the term "about" refers to a +/−10% variation from the nominal value. It is to be understood that such a variation is always included in any given value provided herein, whether or not it is specifically referred to.

Unless defined otherwise, all technical and scientific terms used herein have the same meaning as commonly understood by a person of ordinary skill in the art to which this invention belongs.

The present invention provides a method and apparatus that can modulate the pulse widths over a period of $2^M$ pulse cycles in which each pulse cycle can have its own pulse width or respective duty cycle. The resulting time averaged or effective pulse width therefore can be controlled with a resolution of $2^{N+M}$ states, rather than a resolution of $2^N$ states as is common with standard methods. Through the provision of additional resolution, a luminaire comprising light-emitting elements controlled by the control apparatus of the present invention can generate perceived smooth dimming of the light emitted thereby.

For example, an N-bit pulse width controller requires an N-bit control word which provides a measure for a desired pulse width or a respective duty cycle. The pulse width is typically linearly encoded in the control word such that when the number encoded in the control word is incremented by one the pulse width is extended by a substantially constant amount of time irrespective of the absolute value of the control word. The pulse width per pulse cycle of an N-bit pulse width controller can therefore be controlled with N-bit resolution. A control signal provided by an (N+M)-bit control word, for example, can be used to control how pulse widths in a sequence of pulse cycles can be modulated. In one embodiment, the modulation can be achieved by using, for example an N-bit binary word n and an M-bit binary word m to create m pulse cycles of pulse width n+1 and ($2^M$−m) pulse cycles of pulse width n. In this example however, processing n=$2^N$−1 may require an exception from this procedure, as incrementing n=$2^N$−1 by one can no longer be represented as an N-bit binary number with standard binary encoding schemes. For example, the exception for n=$2^N$−1 can be to create a stream of $2^M$ binary N-bit words of constant n. This may be required, as, otherwise, modulating the pulse widths during a sequence of pulse cycles without an exception for $n=2^N-1$ can create m pulse cycles of minimum duty factor followed by $(2^M-m)$ pulse cycles each having maximum duty factor, with the effect that the effective time averaged pulse width could vary greatly between its maximum and minimum values depending on the number m. The average pulse width per period of $2^M$ pulse cycles therefore amounts to an effective time averaged pulse width that corresponds to $n+m/2^M$, thereby resulting in the ability to control an effective pulse width with a resolution of (N+M) bits.

A particular advantage of the present invention is that the difference in pulse width modulation duty factor between m pulse cycles and the $(2^M-m)$ pulse cycles is 1/N. As noted in for example the IESNA Lighting Handbook, Ninth Edition, pp. 3-21-3-22, the perception of visual flicker of a light source or a surface illuminated thereby is dependent on both temporal frequency and contrast. Whereas a pulse-width modulated light source with 100 percent modulation has a contrast value of 0.01, an extended pulse-width modulated light source has $(100/2^N)$ percent modulation and a contrast value of $(2^N/100)$. Thus, while a light source with a PWM frequency of for example 50 Hertz will exhibit visual flicker in accordance with FIG. 1 (adapted from IESNA Lighting Handbook, Ninth Edition, FIG. 3-34), the same light source with an extended PWM frequency of 800 Hertz and N=4 will exhibit no visual flicker, as it has a contrast value of 0.16.

In an alternate embodiment, controlling the effective pulse width can include, for example, first providing n for $(2^M-m)$ pulses and subsequently n+1 for m pulses or optionally modulating the pulse widths per pulse cycle in decrements of one. In these scenarios however, n=0 may require an exception from the normal procedure. Furthermore, controlling the effective pulse width may include varying the pulse widths per pulse cycle by more than one or controlling the effective pulse width may include randomly varying the pulse widths in the stream of pulse cycles.

The method and apparatus according to the present invention permits choosing the pulse cycle frequency as an independent parameter while modulating the pulse widths. The pulse cycle frequency can be chosen such that attached light-emitting elements, for example LEDs, can be effectively operated under negligible thermal stress conditions and/or the modulation frequency can be chosen sufficiently high to help reduce perceivable light flicker. In one embodiment of the present invention the pulse cycle frequency is selected to be greater than or equal to about 20 kHz. In another embodiment, the pulse cycle frequency is selected to be about 30 kHz.

Figure 2:
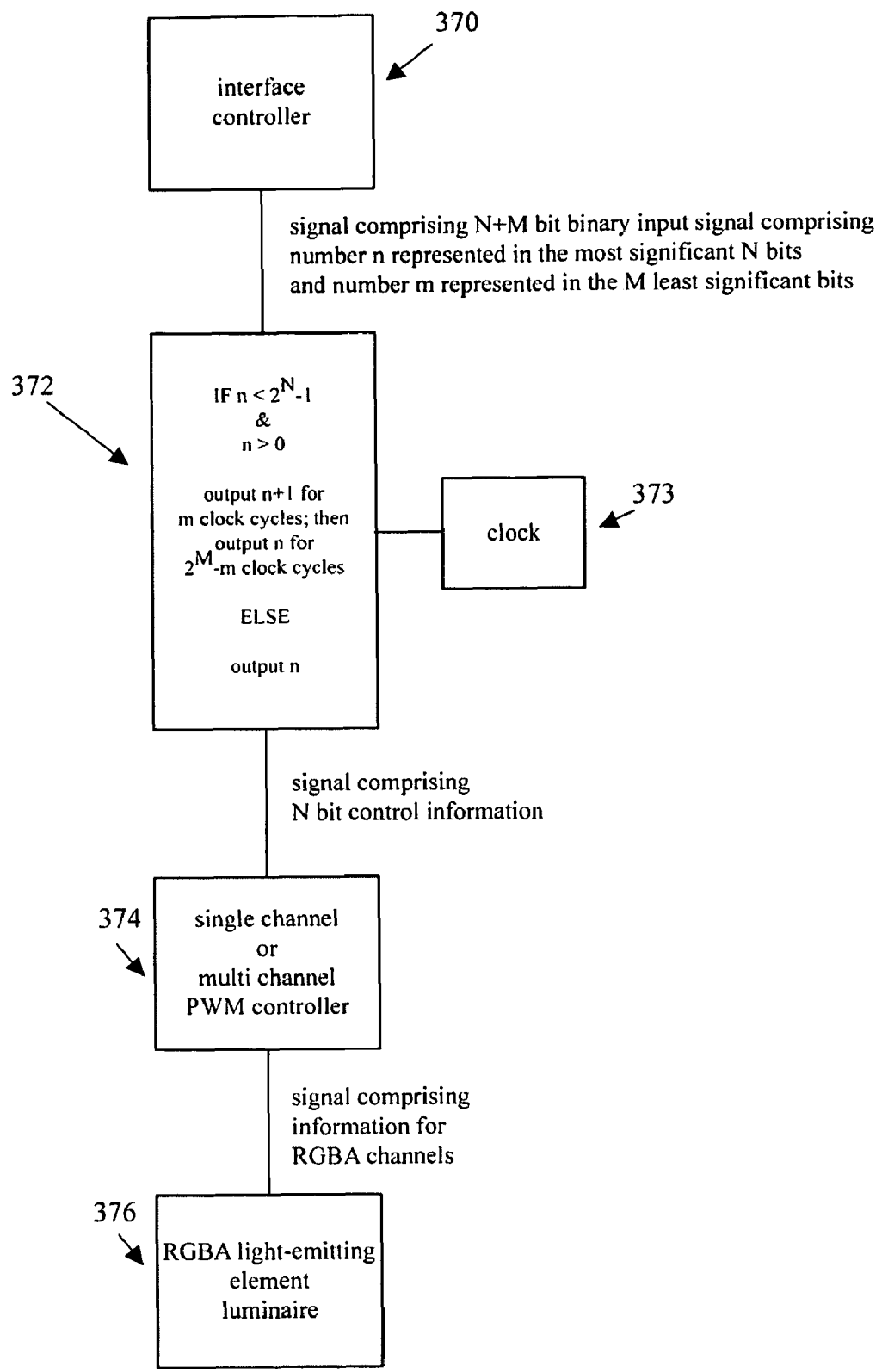
FIG. 2 illustrates a block diagram of the control apparatus for a single or multi-channel lighting apparatus according to one embodiment of the present invention.

FIG. 2 illustrates a block diagram of one embodiment of the present invention for use with a single or multi-channel lighting apparatus. An interface controller 370 provides functionality to forward a signal comprising an (N+M)-bit binary signal comprising a number n, represented by the most significant N bits, and a number m, represented by the least significant M bits of this (N+M)-bit binary signal. The interface controller 370 controls the extended pulse width modulator 372, wherein the extended pulse width modulator generates a signal comprising an N-bit pulse width modulation signal and forwards it to an N-bit single or multi-channel pulse width modulation controller 374. A clock 373 provides the extended pulse width modulator 372 with a synchronisation signal having a predetermined frequency, wherein the clock 373 can be a separate or an integral part of the extended pulse width modulator 372. In this manner the pulse width modulator can process or generate dependent or multiple independent signals for a single or multi-channel pulse width modulation controller 374 which can control multiple channels of light-emitting elements such as LEDs with an effective resolution of $2^{N+m}$.

The single or multi-channel pulse width modulation controller 374 can be attached to a single or multi-colour light-emitting element luminaire 376, wherein a multi-colour luminaire can comprise light-emitting elements that emit one or more light ranges selected from red, green, blue, amber and white, for example. Light-emitting elements associated with a luminaire can be categorized according to their intended colour impression into multiple colour channels, wherein each colour channel can have its own single-channel pulse width modulation controller or can be operatively connected to one predetermined channel of a multi-channel pulse width modulation controller. The single- or multi-channel pulse width modulation controller can be connected to a single or multi-colour channel luminaire that can have a combination of red, green, blue, amber or any other coloured or otherwise categorized light-emitting elements, for example.

Figure 3:
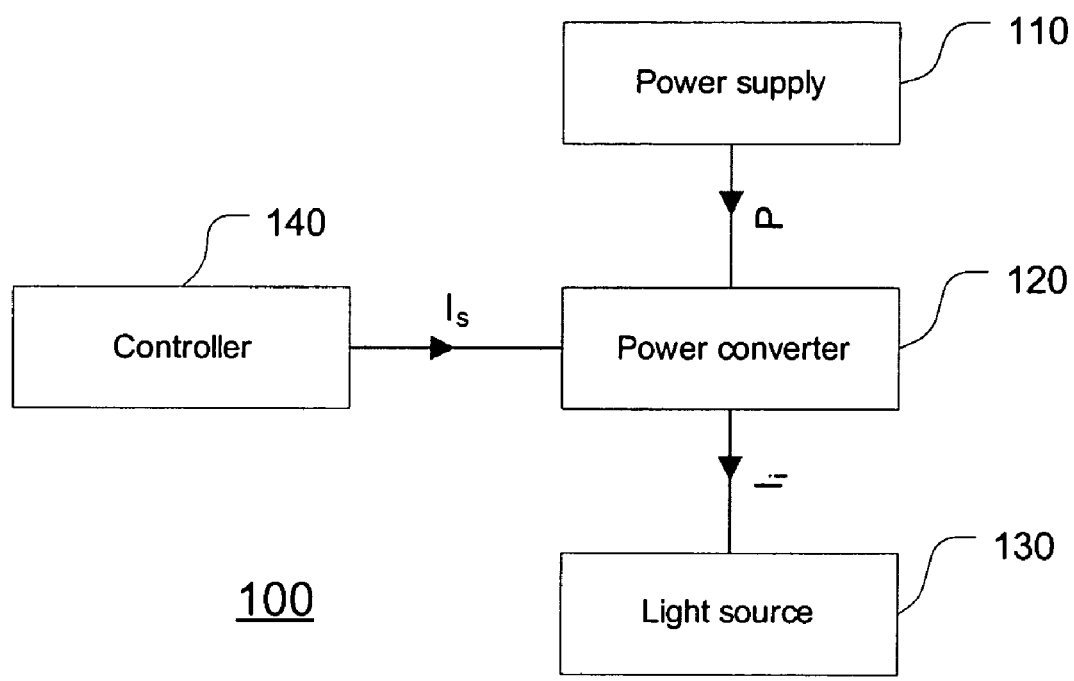
FIG. 3 illustrates a block diagram of a luminaire that can be controlled using the control apparatus according to the present invention.

A luminaire that can be controlled using the method and apparatus according to the present invention is illustrated as a block diagram in FIG. 3. The luminaire 100 comprises a number of components including a power supply 110, a power converter 120, a controller 140, and a light source 130. Each component comprises an input for receiving an input signal, and an output for providing an output signal, however only selected inputs and outputs of these components are illustrated in FIG. 3. Under operating conditions the power supply 110 requires a certain form of electrical power at its input and provides a form P of electrical power at its output. The output of the power supply 110 is connected to the input of the power converter 120, wherein the power converter 120 transforms the electrical power P provided at its input into an electrical drive current $I_i$ which the power converter 120 provides at its output. This electrical drive current $I_i$ is provided to the light source 130 for operation thereof. The controller 140 is operatively coupled to the power converter 120, wherein the controller 140 provides a drive current control signal $I_s$ to the power converter 120. The controller 140 comprises or is adapted for connection to the control apparatus according to the present invention, thereby enabling the controller 140 to control the power converter 120 with a resolution level of $2^{N+M}$ states. Furthermore, the controller 140 can be responsive to signal $I_d$ provided at an (optional) interface input or other input means for example. For example, $I_d$ can be a user desired dimming sequence.

It would be readily understood that a light source 130 can comprise one or more arrays of a plurality of light-emitting elements. For example the arrays can be red LEDs, green LEDs and blue LEDs or any other colour as would be readily understood, for example white LEDs or amber LEDs. A power converter 120 can comprise one or more current drivers wherein for example a current driver can be configured to provide electrical drive current to a selected array of light-emitting elements.

Figure 4:
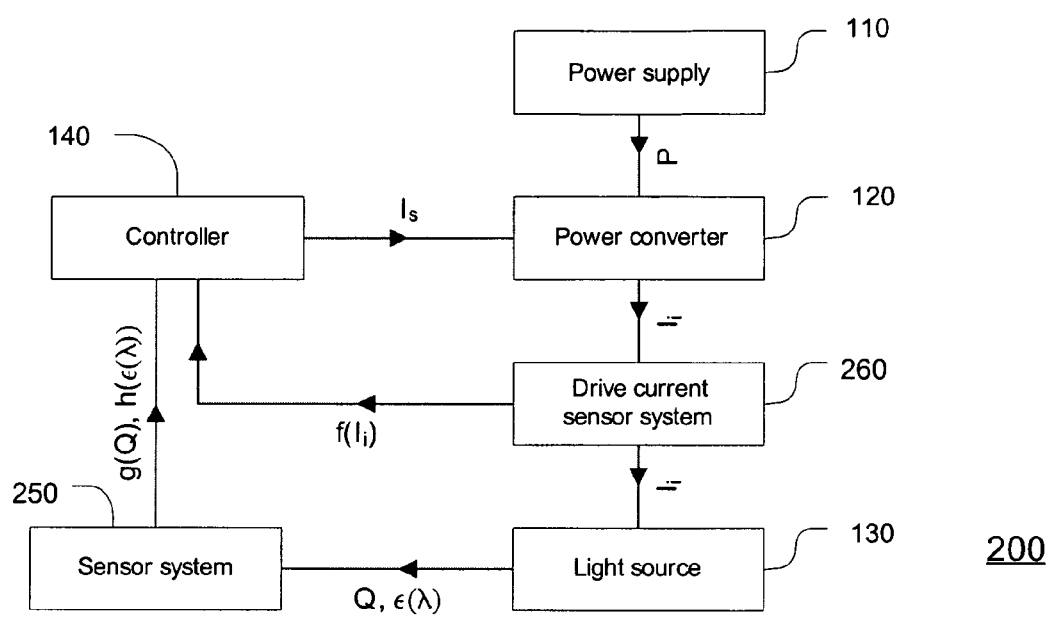
FIG. 4 illustrates a block diagram of another luminaire that can be controlled using the control apparatus according to the present invention.

In another embodiment a luminaire that can be controlled using the method and apparatus according to the present invention can further comprise a feedback system as illustrated in FIG. 4. The luminaire 200 comprises a power supply 110, a power converter 120, a controller 140, and a light source 130. The luminaire 200 additionally comprises any combination of a sensor system 250 and a drive current sensor system 260.

The sensor system 250 can sense any combination of one or more input parameters. The parameters can represent one or more of a portion of the heat Q resulting from the operation of the luminaire or a portion of the spectral density $\epsilon(\lambda)$ of the light emitted by light source 130. The sensor system can process the input parameters which can be indicative of the temperature of a number of components of the light source or the amount and spectral composition of the light emitted by the light source, wherein the amount and spectral composition of the light emitted by the light source can be provided in chromaticity and brightness coordinates, for example. The sensor system 250 can provide any combination of g(Q) or h($\epsilon(\lambda)$) at one or more outputs which are operatively connected to corresponding feedback inputs of the controller 140.

The drive current sensor system 260 may additionally be a portion of the feedback system of the luminaire 200. The drive current sensor system 260 can sense the drive current $I_s$ and provide a measure of its magnitude at its output and this signal can be transmitted to the controller 140. The controller 140 can provide $I_s$ to the power converter 120 accounting for one or more of the sensed input signals, including heat, chromaticity, brightness and drive current in addition to any input signal $I_d$. The signal $I_d$ can represent any combination of measures of the desired drive current, the desired brightness or the desired chromaticity of the emitted light, for example. The controller comprises or is adapted for connection to the control apparatus according to the present invention, thereby enabling the controller to control the power converter 120 and thus the light source 130 with a resolution level of $2^{N+M}$ states.

Figure 5:
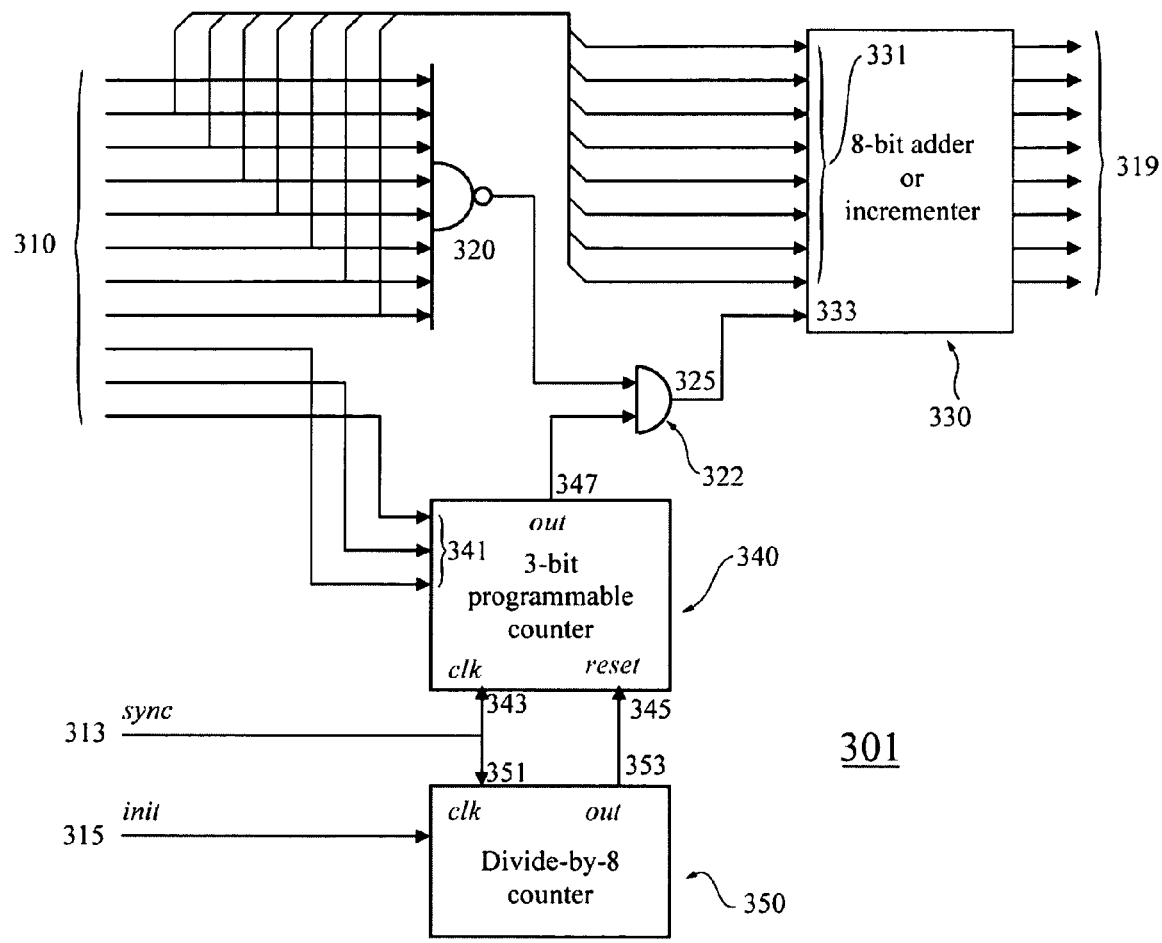
FIG. 5 illustrates a schematic circuit diagram of an embodiment of the present invention.

FIG. 5 illustrates a schematic of an electronic circuit 301 enabling the extended pulse width modulation method according to one embodiment of the present invention. The circuit comprises an eleven-line input bus 310 for receiving an eleven-bit parallel input control signal, a sync signal input line 313, an init signal input line 315, and an eight-bit output bus 319 for providing the parallel output control signal to a compatible eight-bit PWM controller, which is not shown. The circuit includes an exception handling sub-circuit comprising an eight-input NAND gate 320 and a two-input AND gate 325. Eight lines of the eleven-line input bus for carrying the eight most significant bits of the input control signal are accordingly connected to the first port 331 of an eight-bit adder 330. The input line 333 of the second port of the eight-bit adder carrying the least significant bit is connected to the output 325 of the two-input AND gate 322 which also constitutes the output of the exception handling sub-circuit. The remaining seven lines of the second port are not shown and are set to arithmetic zero. Depending on the adder device this can be done by either connecting these lines to arithmetic high or arithmetic low voltage. Three lines of the eleven-line input bus for carrying the three least significant bits of the input control signal are connected to the three control signal input lines 341 of a three-bit programmable counter 340. The three-bit programmable counter further has a clock signal input 343 and a reset signal input 345 connected to the respective lines of the circuit as illustrated in FIG. 5 for receiving the respective signals under operating conditions. A divide-by-eight counter 350 increments its counter upon receiving a predetermined change in the sync signal at its clk input 351. The counter resets to zero upon receiving an init or upon incrementing the counter beyond seven. The out signal output 353 of the divide-by-eight counter is connected to the reset signal input 345 of the three-bit programmable counter. When the divide-by-eight counter 350 resets to zero, an out signal output on its out signal line resets the three-bit programmable counter 340 via its reset signal input. The three-bit programmable counter 340 increments its counter upon detection of a predetermined state change in the sync signal and compares the counter value with the number encoded in the three-bit input control signal. When the counter value exceeds the encoded number, its output 347 changes from logical one to logical zero and the output of the attached two-input AND gate 322 will be zero.

For the embodiment illustrated in FIG. 5, under operational conditions the exception handling sub-circuit prevents the extended pulse width modulation circuit from incrementing an already maximal binary number encoded in the eight most significant bits of the input control signal. This is achieved by setting the least significant bit of the second port of the adder input signal to zero, i.e. by AND combining the output of the eight-input NAND gate and the output of the three-bit programmable counter when the eight most significant bits represent the number $2^8-1$ (generally $2^N-1$).

It would be readily understood by a worker skilled in the art that the total number of bits, the number of most significant bits and the number of least significant bits of the input control signal can be different from the ones specified above. For example, the above circuit can be adapted for attaching a ten-bit PWM controller using an input control signal having ten most significant bits and a predetermined number of least significant bits necessary to achieve a desired effective PWM resolution.

Furthermore, as would be obvious to a person skilled in the art, the circuit for extended pulse width modulation can also include input or output signal buffer elements such as latches, registers, and multiplexers. The circuit can be modified for example for receiving input signals or providing output signals on systems other than parallel bus systems.

In one embodiment, an incrementer can be used in place of the eight-bit adder identified in the above circuit. The incrementer can have one control signal input port, for example a single eight bit input port, and increments the number represented by a signal applied to the control signal input port by one, upon detection of a predetermined state change in a trigger signal applied to a trigger signal port which would occur under operating conditions.

Figure 6:
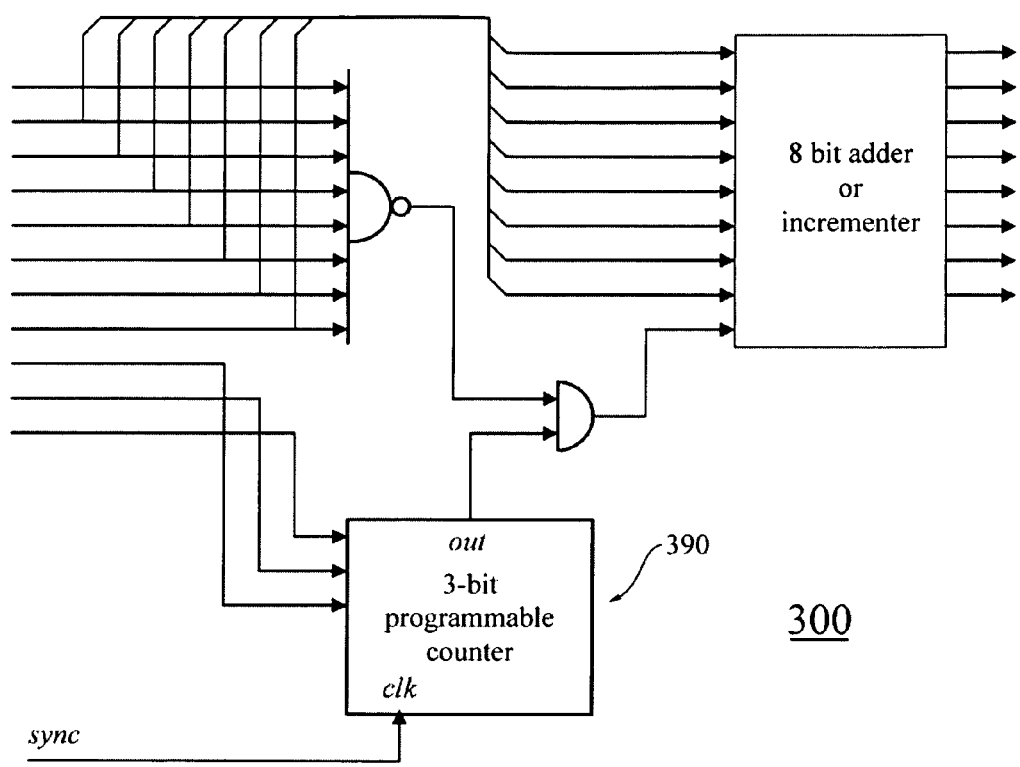
FIG. 6 illustrates a schematic circuit diagram of another embodiment of the present invention.

FIG. 6 illustrates a schematic of electronic circuit 300 enabling the extended pulse width modulation method according to another embodiment of the present invention, wherein the divide-by-eight counter as seen in FIG. 5, has been removed. This embodiment uses fewer components and can be used if a sudden state change in the input control signal always happens synchronously when the three-bit counter resets to zero, for example or if a state change in the input control signal happens asynchronously and the action of instantaneously resetting the three-bit programmable counter 390 is not required. Taking into account the pulse cycle duration or frequencies for general lighting purposes the asynchronous state change generally does not need any exception handling, since state changes in the input control signal typically occur on a timescale of multiples rather than fractions of eight pulse cycles (generally $2^M$ pulse cycles). The circuit 300 may produce, due to state changes in the input control signal other than at the beginning of an eight pulse cycle period (generally $2^M$ pulse cycle period), averaged pulse width duty factors which deviate from the specified duty factor encoded in the eleven bit (generally (N+M)-bit) input control signal by no more than an equivalent of a single least significant bit change in the input control signal.

Figure 7:
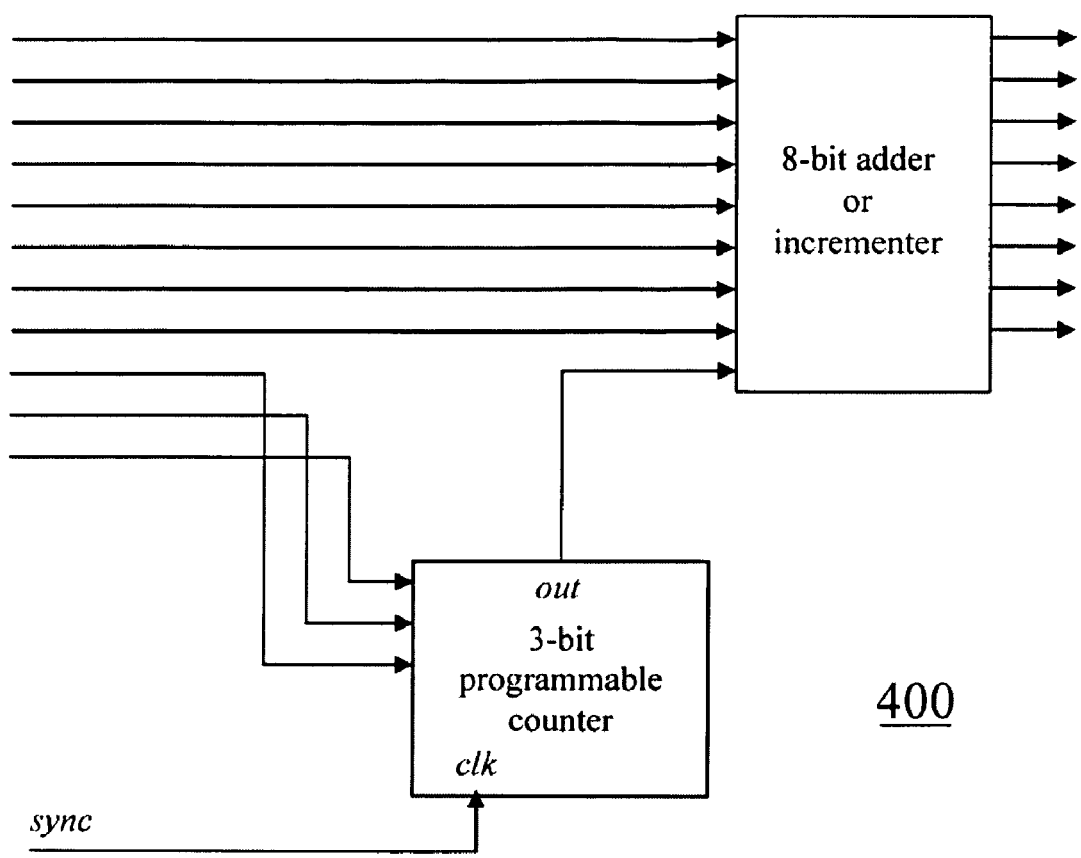
FIG. 7 illustrates a schematic circuit diagram of another embodiment of the present invention.

FIG. 7 illustrates a schematic of another embodiment of an electronic circuit 400 enabling the extended pulse width modulation method, wherein the exception handling sub-circuit as illustrated in FIG. 5, has been eliminated. In this embodiment, when all eight most significant bits (generally N most significant bits) are set to logical high, the eight bit adder or incrementer "overflows" i.e. resets its output signals to zero. Depending on the number m encoded in the three least significant bits (generally M least significant bits) of the input control signal, this circuit sets all output signals to logical zero for a period of m predetermined changes in the sync signal (pulse cycles) and sets the output signals to logical one for a subsequent eight minus m pulse cycles (generally ($2^M$−m) pulse cycles) provided that the input control signals do not change during the total period of eight pulse cycles (generally $2^M$ pulse cycles). The circuit illustrated in FIG. 7 can be used for example, when it is not required to suppress such an overflow condition, or when the eight most significant bits (generally N most significant bits) of the input control signal never concurrently assume their logical high (arithmetical one) values.

Figure 8:
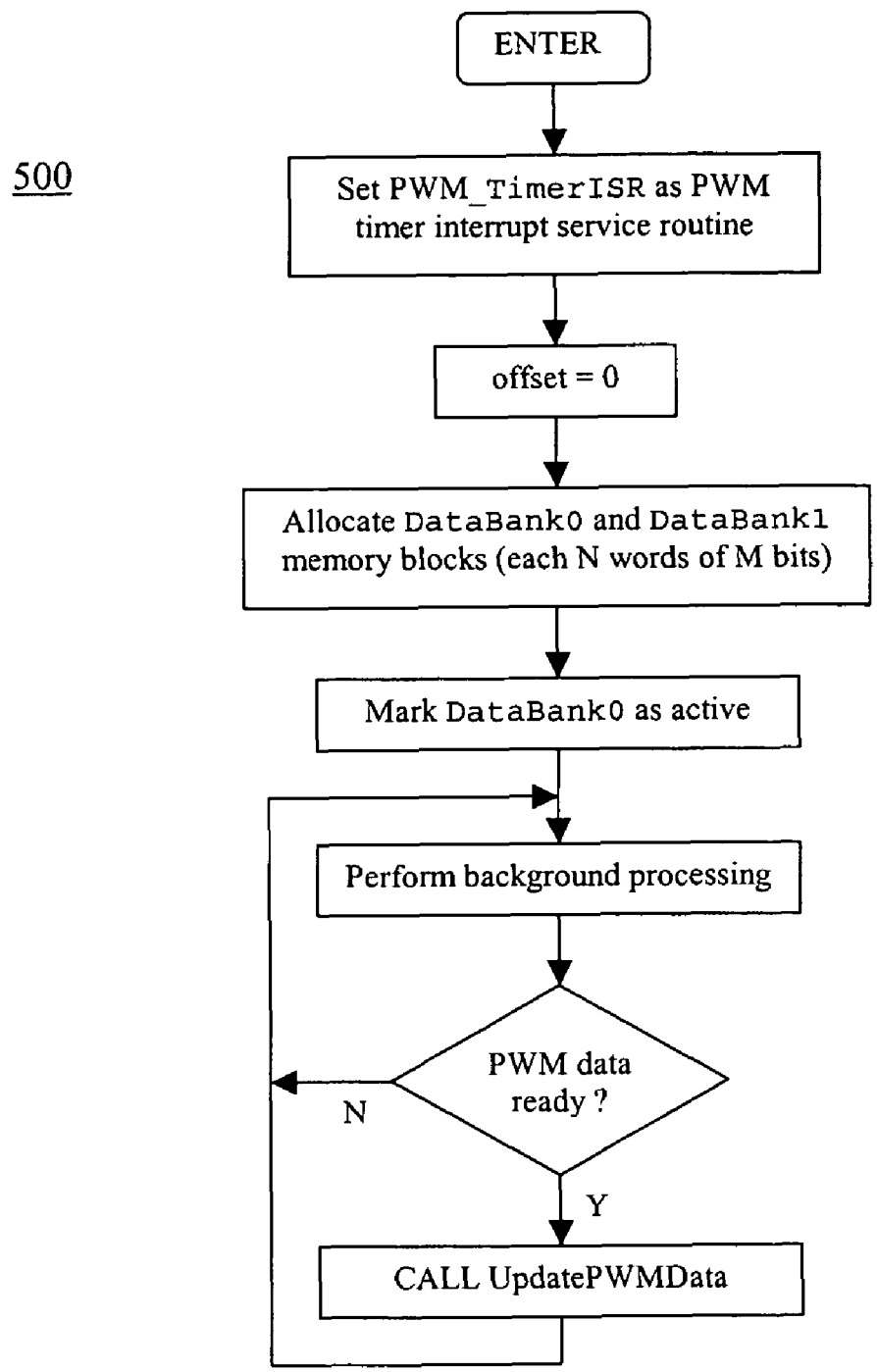
FIG. 8 illustrates a flow diagram for a micro controller main program for controlling the light sources using PWM, according to one embodiment of the present invention.
Figure 9:
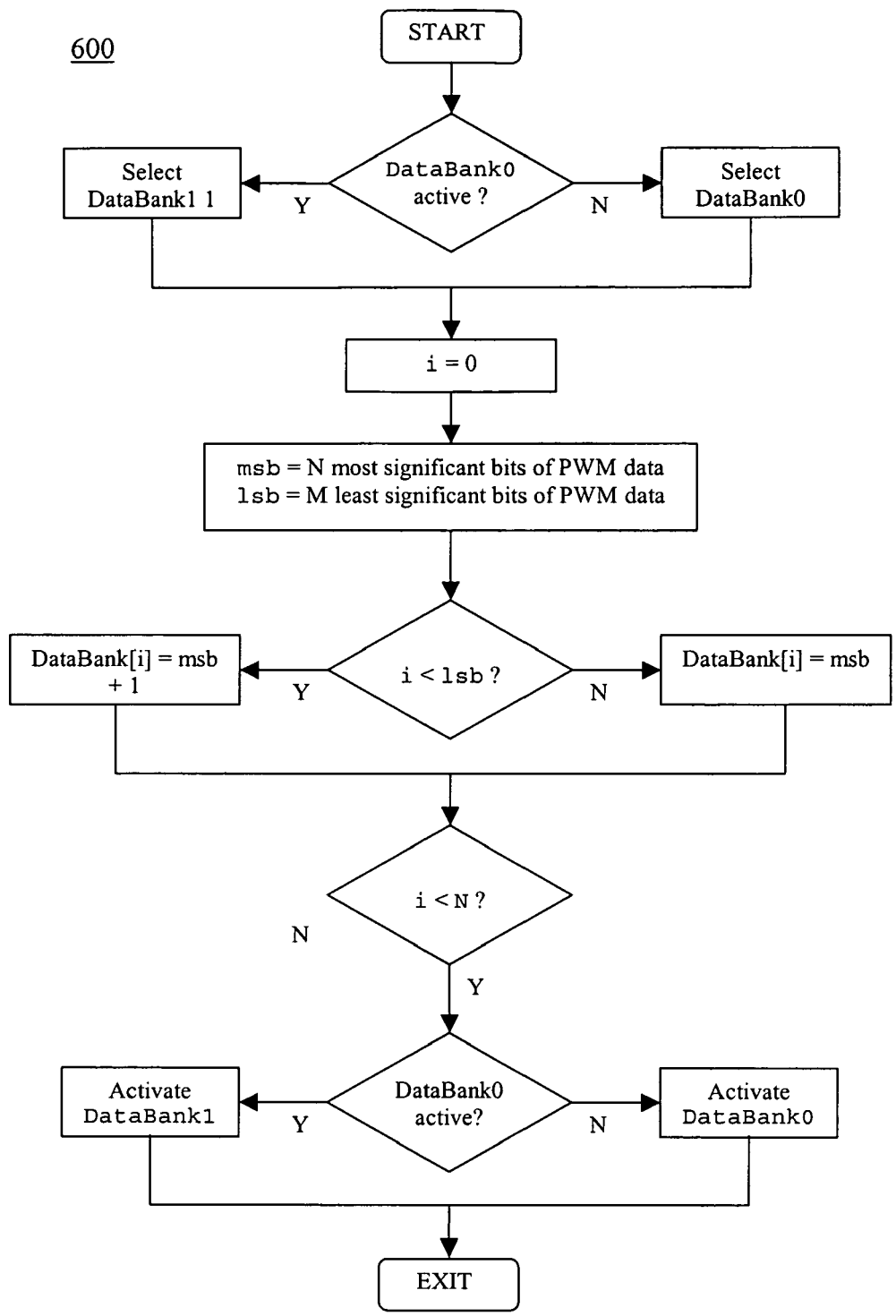
FIG. 9 illustrates a flow diagram for a subroutine for the main program as illustrated in FIG. 8.
Figure 10:
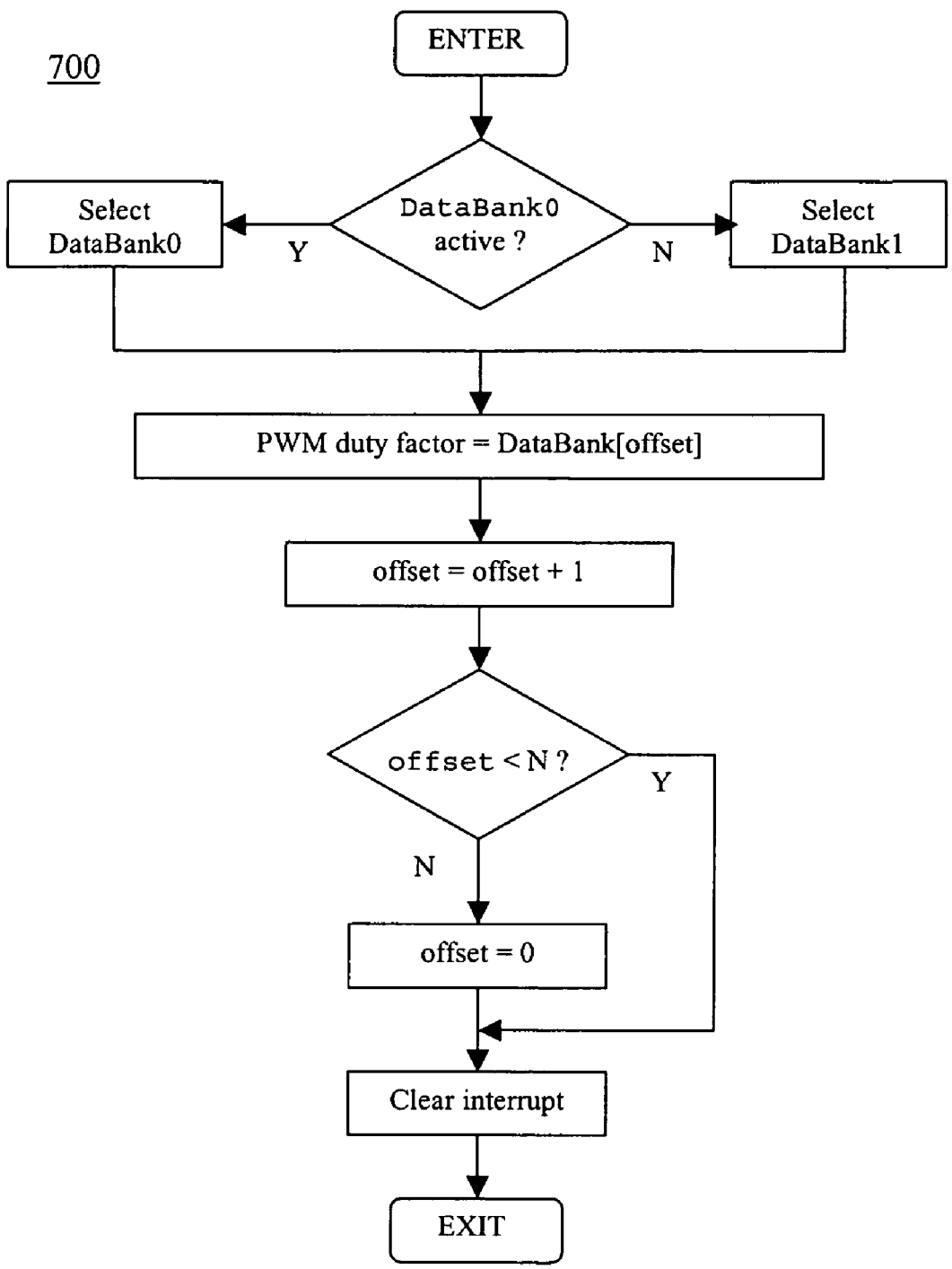
FIG. 10 illustrates a flow diagram for another subroutine for the main program as illustrated in FIG. 8.

In another embodiment, the extended PWM controller can be implemented in firmware as shown in FIGS. 8 to 10 for use with, for example, a Philips LPC2132 microcontroller.

FIG. 8 illustrates a microcontroller main_PWM function 500 according to one embodiment of the present invention. This function specifies the function PWM_TimerISR as a PWM period timer interrupt service routine, initializes static variable offset to zero, allocates two blocks of random access memory called DataBank0 and DataBank1, wherein each block comprises N words of M bits, and marks DataBank0 as active. The function then enters a continuous loop wherein it polls an external device, such as a remote interface, for available PWM data. Alternatively, the data may also be generated within main_PWM program 500. When PWM data which comprises an N+M-bit word is available, the main_PWM program calls the UpdatePWMData function.

FIG. 9 illustrates the UpdatePWMData function 600 according to one embodiment of the present invention, wherein this function first determines which data bank is active, then selects the inactive data bank to write any subsequent data to. It then sets loop counter i to zero and sets msb as the N most significant bits and lsb as the M least significant bits of the N+M signal before performing N loops, wherein within each loop it sets the $i^{th}$ memory location of the selected data bank to msb+1 if i is less than lsb, else it sets the $i^{th}$ memory location to msb. Upon completion, it marks the active data bank as inactive and the inactive data bank as active before returning to the calling function main_PWM.

FIG. 10 illustrates the PWM period timer interrupt service routine PWM_TimerISR 700 according to one embodiment of the present invention, wherein this routine first determines which data bank is active, and then selects the active data bank to read data from. It then reads the $offset^{th}$ element of the active data bank, sets the PWM period timer hardware register to this value, and increments the static variable offset. If offset is then equal to N, it is reset to zero. The timer interrupt flag is then cleared and the interrupt function PWM_TimerISR exits.

In one embodiment, the present invention can be applied to pulse code modulation (PCM) rather than PWM. Having specific regard to FIG. 2, the PWM controller 374 can be replaced with a PCM controller. A PCM based embodiment can be implemented with a firmware controlled general-purpose microcontroller, for example, a Philips LPC2132 microcontroller. This implementation is illustrated in FIGS. 11 to 13.

Figure 11:
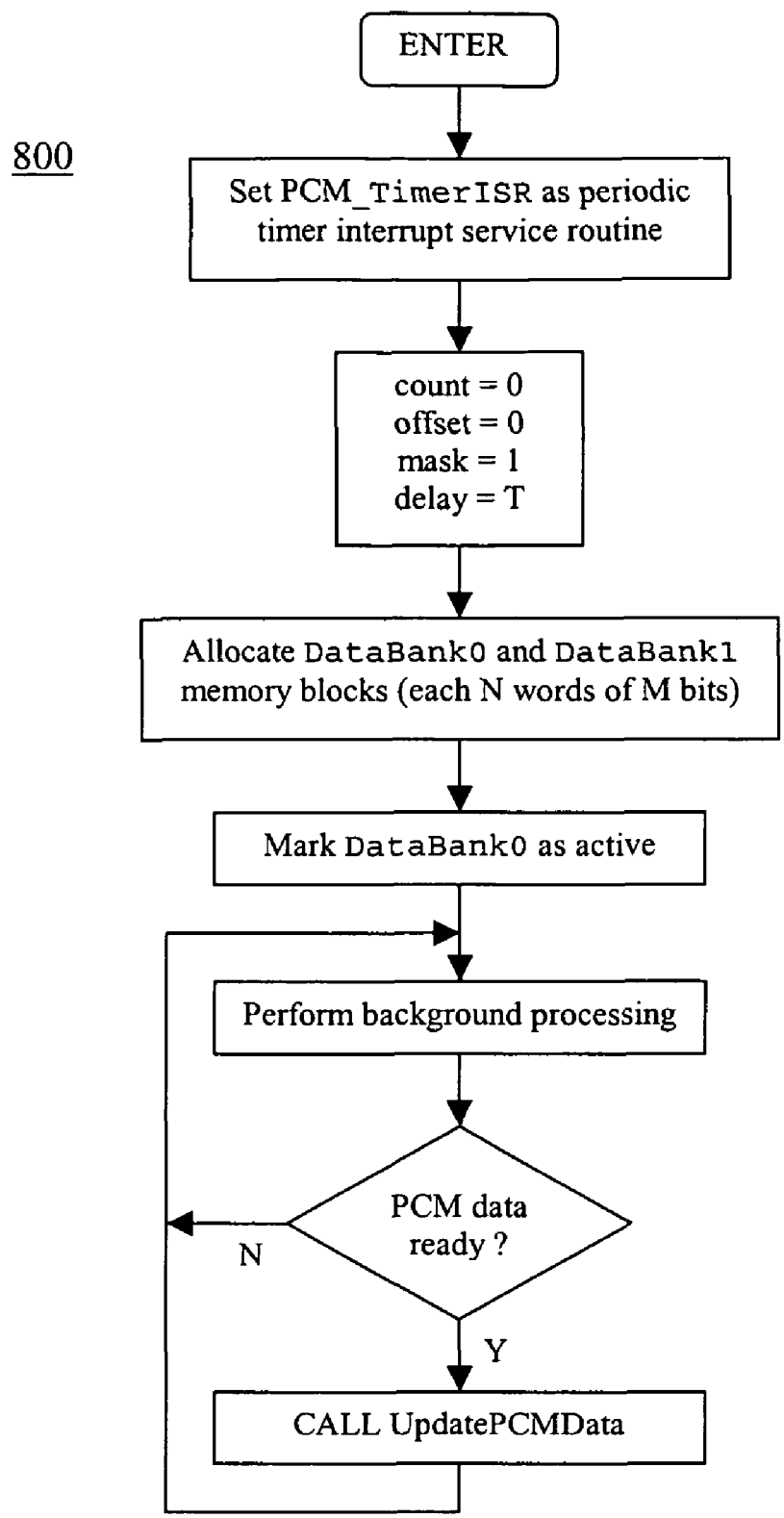
FIG. 11 illustrates a flow diagram for another micro controller main program for controlling the light sources using PCM, according to one embodiment of the present invention.

FIG. 11 illustrates a microcontroller main_PCM function 800 according to one embodiment of the present invention. This function specifies the function PCM_TimerISR as a periodic timer interrupt service routine, initializes static variables Count and Offset to zero, Mask to 1, and timer Delay to T (where T is typically one microsecond), allocates two blocks of random access memory called DataBank0 and DataBank1, wherein each block comprises N words of M bits, and marks DataBank0 as active. The function then enters a continuous loop wherein it polls an external device, such as a remote interface, for available PCM data. Alternatively, the data may also be generated within the main_1 function (not illustrated). When PCM data comprising an N+M-bit word is available, the main_1 function calls the UpdatePCMData function.

Figure 12:
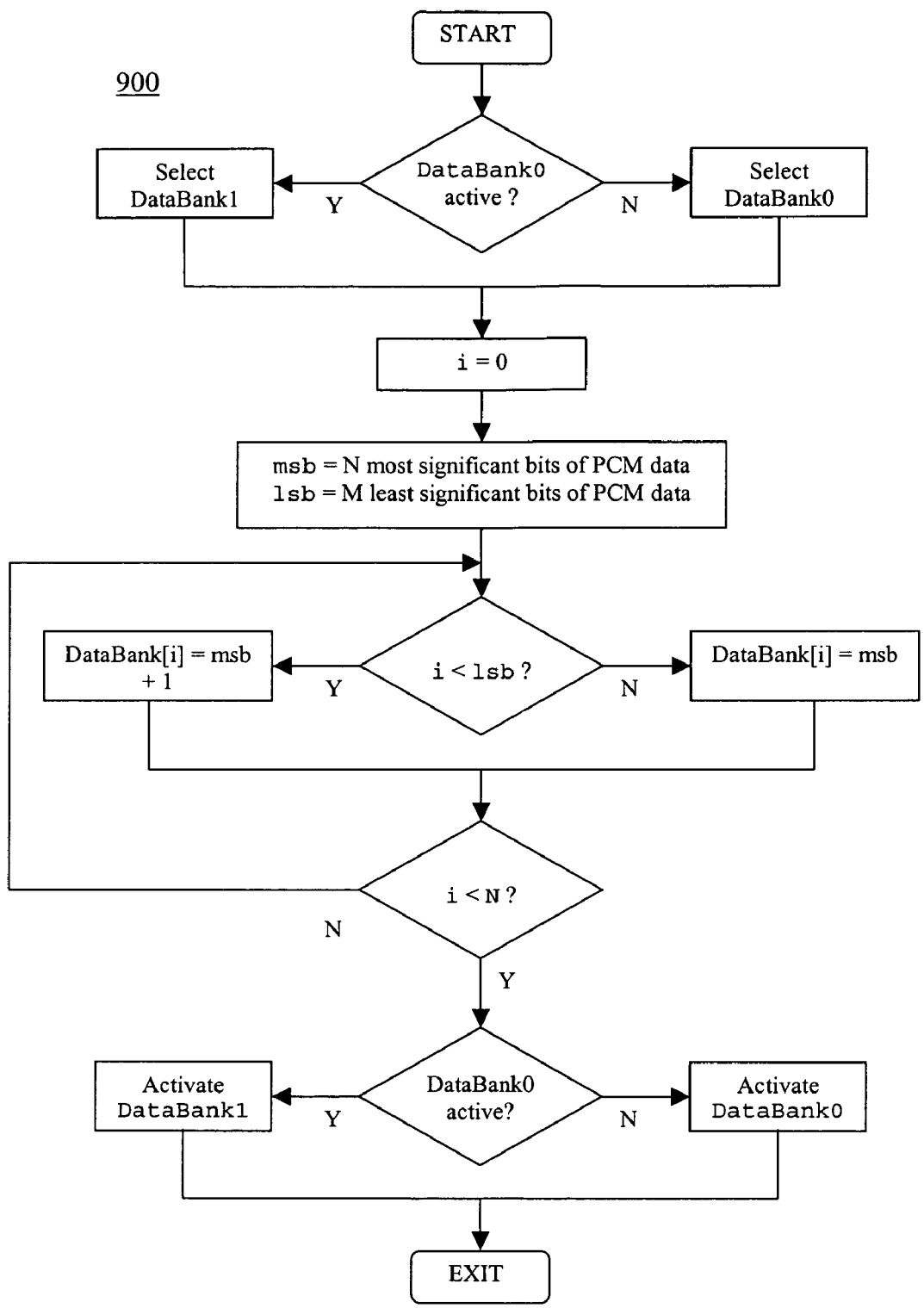
FIG. 12 illustrates a flow diagram for a subroutine for the main program as illustrated in FIG. 11.

FIG. 12 illustrates the UpdatePCMData routing function 900 according to one embodiment of the present invention, wherein this function first determines which data bank is active, then selects the inactive data bank to write any subsequent data to. It then sets loop counter i to zero and sets msb as the N most significant bits and lsb as the M least significant bits of the N+M signal before performing N loops, wherein within each loop it sets the $i^{th}$ memory location of the selected data bank to msb+1 if i is less than lsb, else it sets the $i^{th}$ memory location to msb. Upon completion, it marks the active data bank as inactive and the inactive data bank as active before returning to the calling function main_1.

Figure 13:
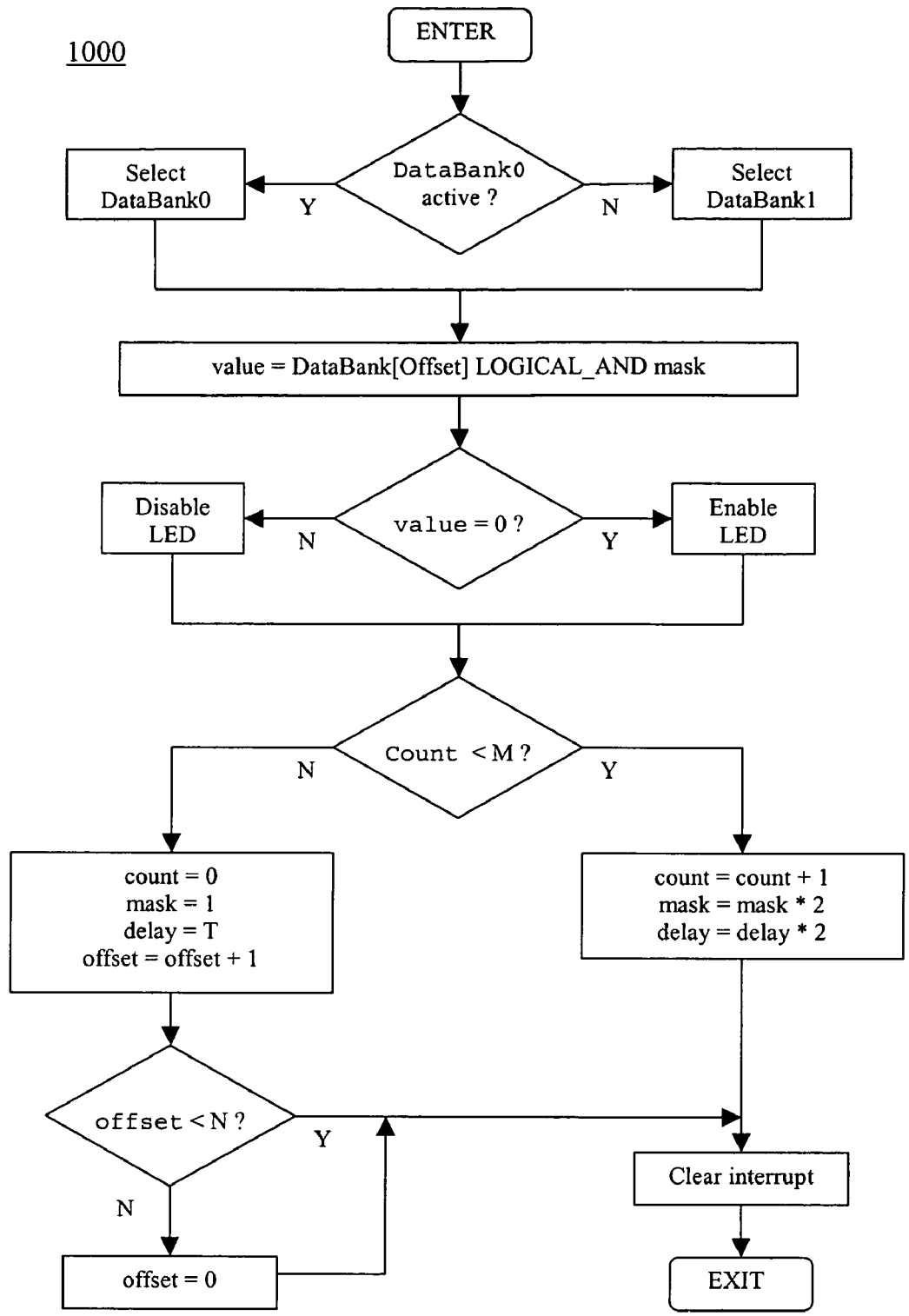
FIG. 13 illustrates a flow diagram for another subroutine for the main program as illustrated in FIG. 11.

FIG. 13 illustrates the periodic timer interrupt service routine PCM_TimerISR 1000 according to one embodiment of the present invention, wherein this routine first determines which data bank is active, and then selects the active data bank to read data from. It then reads the $offset^{th}$ element of the active data bank and performs a logical AND with the static mask variable to determine the $count^{th}$ bit of the element. If the bit is zero, the LED channel is disabled; otherwise, it is enabled. If count is less than M, then the static variable count is incremented, the static variable mask is multiplied by two to effect a logical left shift of the binary bit, and the static variable delay, which represents the timer delay, is multiplied by two. Otherwise, count is reset to zero, mask is reset to one, delay is reset to T, and the static variable offset is incremented. When offset is then equal to N, it is reset to zero. Finally, the timer interrupt flag is cleared and the interrupt function PCM_TimerISR exits.

In one embodiment of the present invention, pulse widths can be defined in control coordinates (n,m,N,M). It would be obvious to a worker skilled in the art that all such pulse widths can be transformed into a time domain by merely applying a simple coordinate transformation. For example, a pulse width pw whose duration is specified by a specific PWM control number n can have a time duration of, for example, pw=($2^N$−1)$^{-1}$*n*PW in which PW is the period of the pulse cycle. Alternatively, the transformation can also be defined by $2^{-N}$*(n*PW); the specific choice is a mere matter of choosing the zero origin for n.

In one embodiment of the present invention, the control method can be implemented in an apparatus or system having one or more output channels to jointly or separately control each channel either simultaneously or in a time-multiplexed fashion, wherein each channel can be used to drive a certain color of light-emitting elements, for example.

The invention will now be described with reference to specific examples. It will be understood that the following examples are intended to describe embodiments of the invention and are not intended to limit the invention in any way.

EXAMPLES

It is known that pulse width modulation of light-emitting elements for example LEDs, for solid-state luminaires must have a PWM frequency of at least about 300 Hz to avoid the perception of visual flicker and a PWM duty factor resolution of at least 12 bits, and preferably a PWM frequency of at least about 10 kHz to alleviate the detrimental effects of thermal stress on the LED dies. The following examples illustrate the application of the present invention to the control and operation of solid-state luminaires. As may be readily understood, a multiplicity of phosphor-coated white light LEDs for example may be controlled by one controller, while a plurality of red, green, blue, and optionally amber LEDs or white, green, and blue LEDs for example may be controlled by a multiplicity of controllers, with preferably one controller for each LED color.

Example 1

Solid-State Luminaire with Extended Pulse Code Modulation Control

According to one embodiment of the present invention a solid-state lighting luminaire can be configured as illustrated in FIG. 4, wherein the extended pulse width modulation as defined above is implemented in firmware on the controller 140, for example a commercial microcontroller, by using the extended pulse code modulation method as illustrated FIGS. 11 to 13. One or more calibrations are implemented on the controller resulting from collected data reflecting one or more of chromaticity, luminous flux, temperature of the LEDs and drive current, thereby enabling feedback control of the solid-state luminaire.

Example 2

Solid-State Luminaire with Extended Pulse Width Modulation Control

According to one embodiment of the present invention a solid-state lighting luminaire can be configured as illustrated in FIG. 4, wherein the extended pulse width modulation as defined above is implemented in firmware on the controller 140, for example a commercial microcontroller, by using the extended pulse width modulation method as illustrated FIGS. 8 to 10. The controller can comprise one or a plurality of integrated 10-bit analog-to-digital converter modules, wherein other functions may also be implemented, such as for example sensor monitoring and feedback control.

Example 3

Solid-State Luminaire with Extended Pulse Code Modulation Control

Referring to FIG. 4, the extended pulse width modulation method disclosed herein may be implemented in the controller 140 using the extended pulse width modulation as disclosed in FIGS. 11 to 13 implemented in hardware using for example a field-programmable gate array (FPGA) with preferably a microcontroller core. Other functions may be implemented within the luminaire including for example sensor monitoring and feedback control.

It is obvious that the foregoing embodiments of the invention are exemplary and can be varied in many ways. Such present or future variations are not to be regarded as a departure from the spirit and scope of the invention, and all such modifications, as would be obvious in the art, are intended to be included within the scope of the following claims.

I claim:

1. An apparatus for control of a luminaire including one or more light-emitting elements in one or more colors, each of the one or more light-emitting elements being supplied with electrical current to produce light, said apparatus comprising a modulator configured to:

adjust the electrical current to the one or more light-emitting elements using pulse width modulation or pulse code modulation based on an N+M input control signal that includes an N-bit word of N most significant bits having a value n with a maximum value of $2^N-1$, and an M-bit word of M least significant bits having a value m, each of said pulse width modulation and pulse code modulation having a pulse cycle; and modulate a pulse width for each pulse cycle based on the N+M input control signal for increasing control resolution of the one or more light-emitting elements from $2^N$ to $2^{N+m}$ states when $n<2^N-1$ and $n>0$, where N and M are integers greater that zero and N is greater than M, the modulator including an N-bit controller.

2. The apparatus according to claim 1, wherein said modulator for modulating the pulse width comprises a N-bit adder operatively coupled to the N-bit controller, said N-bit adder providing the N-bit controller with N-bit control signals for controlling the electrical current to the one or more light-emitting elements, the modulator further comprising an M-bit programmable counter coupled to the N-bit adder, said M-bit programmable counter being configured to extent the control resolution to the $2^{N+M}$ states when the value n the N-bit word is greater than zero and less than the maximum value.

3. The apparatus according to claim 2, wherein said modulator for modulating the pulse width further comprises an exception handling circuit operatively connected to the M-bit programmable counter and the N-bit adder.

4. The apparatus according to claim 3, wherein said modulator for modulating the pulse width further comprises a divide by N counter operatively connected to the M-bit programmable counter, said divide by N counter for resetting the M-bit programmable counter.

5. The apparatus according to claim 1, wherein said modulator for modulating the pulse width comprises an incrementer operatively coupled to the N-bit controller, said incrementer providing the N-bit controller with control signals for controlling the electrical current to the one or more light-emitting elements, the modulator for modulating the pulse width further comprising a M-bit programmable counter coupled to the N-bit adder.

6. The apparatus according to claim 1, wherein said apparatus operates at a cycle frequency greater than or equal to about 20 kHz.

7. The apparatus according to claim 6, wherein said apparatus operates at a cycle frequency of about 30 kHz.

8. An extended pulse width modulation method for transforming a (N+M)-bit signal into a stream of $2^M$ words of N-bit width for a total of $2^M$ pulse cycles, the method comprising the acts of:

a) receiving the (N+M)-bit signal that includes an N-bit word of N most significant bits having a value n represented by a first binary coded number, the value n having a maximum value of $2^N-1$, and an M-bit word of M least significant bits having a value m represented by a second binary coded number;

b) splitting the (N+M)-bit signal into an N-bit portion and an M-bit portion;

c) interpreting the N-bit portion as the first binary coded number having the value n;

d) interpreting the M-bit portion as the second binary coded number having the value m;

e) encoding a third binary coded number having a value n+1 in a form of a first binary N-bit word and feeding the first binary N-bit word for m pulse cycles into the stream; and f) encoding the first binary coded number having the value n in a form of a second binary N-bit word for ($2^M$−m) pulse cycles and feeding the second binary N-bit word into the stream when n<$2^N$−1 and n>0; thereby forming the stream of $2^M$ words of N-bit width for a total of $2^M$ pulse cycles, where N and M are integers greater than zero and N is greater than M.

9. An extended pulse width modulation apparatus for transforming a (N+M)-bit signal into a stream of $2^M$ words of N-bit width for a total of $2^M$ pulse cycles, the apparatus comprising:
   an interface for receiving the (N+M)-bit signal that includes an N-bit word of N most significant bits having a value n represented by a first binary coded number, the value n having a maximum value of $2^N$−1, and an M-bit word of M least significant bits having a value m represented by a second binary coded number;
   an interface for splitting the (N+M)-bit signal into an N-bit portion and an M-bit portion, for interpreting the N-bit portion as the first binary coded number having the value n and for interpreting the M-bit portion as the second binary coded number having the value m; and
   a modulator for encoding a third binary coded number having a value n+1 in a form of a first binary N-bit word and feeding the first binary N-bit word for m pulse cycles into the stream, and for encoding the first binary coded number having the value n in a form of a second binary N-bit word for ($2^M$−m) pulse cycles and feeding the second binary N-bit word into the stream when n<$2^N$−1 and n>0; thereby forming the stream of $2^M$ words of N-bit width for a total of $2^M$ pulse cycles, where N and M are integers greater than zero and N is greater than M.

10. An apparatus for controlling a light source comprising:
   a pulse modulator configured to increase control resolution of the light source from $2^N$ to $2^{N+M}$ states, using an N+M input control signal to generate an N-bit pulse modulation signal; and
   an N-bit controller configured to receive the N-bit pulse modulation signal for controlling the light source;
   wherein the pulse modulator comprises:
   an M-bit counter configured to receive an M-bit word of M least significant bits of the N+M input control signal, and to provide a counter output;
   an N-bit adder configured to receive at a first input port an N-bit word of N most significant bits of the N+M input control signal, to receive at a second input port a logic bit, and to provide the N-bit pulse modulation signal to the N-bit controller;
   a logic unit configured to receive the counter output and a combination of the N-bit word, and to provide the logic bit to the N-bit adder, where N and M are integers greater than zero and N is greater than M, wherein the logic unit sets the logic bit to zero when the N-bit word has a maximum value.

11. The apparatus of claim 10, further comprising an N-bit pulse width modulation for receiving the N-bit output from the N-bit adder for controlling the light source with a control resolution which is increased from $2^N$ to $2^{N+M}$ states based on the logic bit when a value n of the N-bit word is greater than zero and less than the maximum value.

12. The apparatus of claim 10, wherein remaining N−1 lines of the second port are set to zero.

13. The apparatus of claim 10, wherein the M-bit word comprises least significant bits of the N+M input control signal.

14. The apparatus of claim 10, wherein the logic unit comprises an AND gate that outputs the logic bit, the AND gate having a first input and a second input, the first input of the AND gate being connected to an output of eight-input NAND gate that receives the N-bit word, and the second input receiving the counter output.

15. The apparatus of claim 14, wherein the counter output changes from a logical one to a logical zero when a value of the counter exceeds a number encoded in the M-bit word.

* * * * *